(12) United States Patent
Hsieh et al.

(10) Patent No.: US 11,035,886 B2
(45) Date of Patent: *Jun. 15, 2021

(54) ON-CHIP OSCILLOSCOPE

(71) Applicant: TAIWAN SEMICONDUCTOR MANUFACTURING CO., LTD., Hsinchu (TW)

(72) Inventors: Chung-Peng Hsieh, New Taipei (TW); Chih-Chiang Chang, Taipei (TW); Chung-Chieh Yang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 208 days.

This patent is subject to a terminal disclaimer.

(21) Appl. No.: 16/212,090

(22) Filed: Dec. 6, 2018

(65) Prior Publication Data

US 2019/0107562 A1 Apr. 11, 2019

Related U.S. Application Data

(63) Continuation of application No. 14/991,936, filed on Jan. 9, 2016, now Pat. No. 10,161,967.

(51) Int. Cl.
| | |
|---|---|
| *G01R 19/00* | (2006.01) |
| *G01R 13/00* | (2006.01) |
| *G01R 13/02* | (2006.01) |
| *G01R 31/28* | (2006.01) |
| *G01R 31/317* | (2006.01) |

(52) U.S. Cl.
CPC ......... *G01R 13/00* (2013.01); *G01R 13/0218* (2013.01); *G01R 31/2851* (2013.01); *G01R 31/31726* (2013.01)

(58) Field of Classification Search
CPC .... G01R 13/00; G01R 13/0218; G01R 31/28; G01R 31/2851; G01R 31/3176; G01R 31/2831; G01R 31/2884; G01R 31/31924; G01R 31/3004; G01R 31/3008; G01R 31/318511; G01R 31/2648
See application file for complete search history.

(56) References Cited

U.S. PATENT DOCUMENTS

| | | | | |
|---|---|---|---|---|
| 5,684,421 A | * | 11/1997 | Chapman ......... | G01R 31/31922 327/261 |
| 6,929,962 B1 | | 8/2005 | Chang | |
| 7,782,075 B2 | * | 8/2010 | Suda ................ | H03K 19/00384 324/750.3 |

(Continued)

FOREIGN PATENT DOCUMENTS

| | | |
|---|---|---|
| EP | 1 847 843 A1 | 10/2007 |
| JP | H07-218550 A | 8/1995 |
| JP | 2000-292497 A | 10/2000 |

*Primary Examiner* — Thang X Le
(74) *Attorney, Agent, or Firm* — Maschoff Brennan (57) ABSTRACT

A device is disclosed that includes a control circuit and a scope circuit. The control circuit is configured to delay a voltage signal to generate a first control signal. The scope circuit is configured to be operated in one of a first mode and a second mode according to the first control signal. In the first mode, the scope circuit is configured to generate a first current signal indicating amplitudes of the voltage signal, and in the second mode, the scope circuit is configured to stop generating the first current signal.

20 Claims, 6 Drawing Sheets

(56) References Cited

U.S. PATENT DOCUMENTS

| | | | |
|---|---|---|---|
| 8,269,535 B1 * | 9/2012 | Chou | H03L 7/0816 |
| | | | 327/158 |
| 8,664,978 B2 | 3/2014 | Lu et al. | |
| 9,030,176 B2 * | 5/2015 | Onouchi | G06F 1/26 |
| | | | 323/269 |
| 2006/0197697 A1 | 9/2006 | Nagata | |
| 2008/0093597 A1 | 4/2008 | Kiyota | |
| 2009/0039939 A1 * | 2/2009 | Hasumi | G01R 31/31727 |
| | | | 327/281 |
| 2009/0240456 A1 | 9/2009 | Tesler | |
| 2013/0049810 A1 | 2/2013 | Lu et al. | |
| 2015/0177327 A1 | 6/2015 | Chien et al. | |
| 2015/0323944 A1 | 11/2015 | Youssef et al. | |
| 2016/0131708 A1 | 5/2016 | Huang et al. | |

* cited by examiner

ON-CHIP OSCILLOSCOPE

RELATED APPLICATIONS

This application is continuation of U.S. application Ser. No. 14/991,936, filed Jan. 9, 2016, now U.S. Pat. No. 10,161,967, issued Dec. 25, 2018, which is herein incorporated by reference.

BACKGROUND

In an integrated circuit (IC), there are many electrical elements. These on-chip elements may be unable to be tested after manufacture. As such, in some applications, an on-chip oscilloscope is developed to test the electrical elements in the chips at wafer acceptance testing (WAT) stage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Secondly, the terms "comprise," "comprising," "include," "including," "has," "having," etc. used in this specification are open-ended and mean "comprises but not limited".

In addition, the term "coupled" may also be termed as "electrically coupled", and the term "connected" may be termed as "electrically connected". "Coupled" and "connected" may also be used to indicate that two or more elements cooperate or interact with each other.

Figure 1:
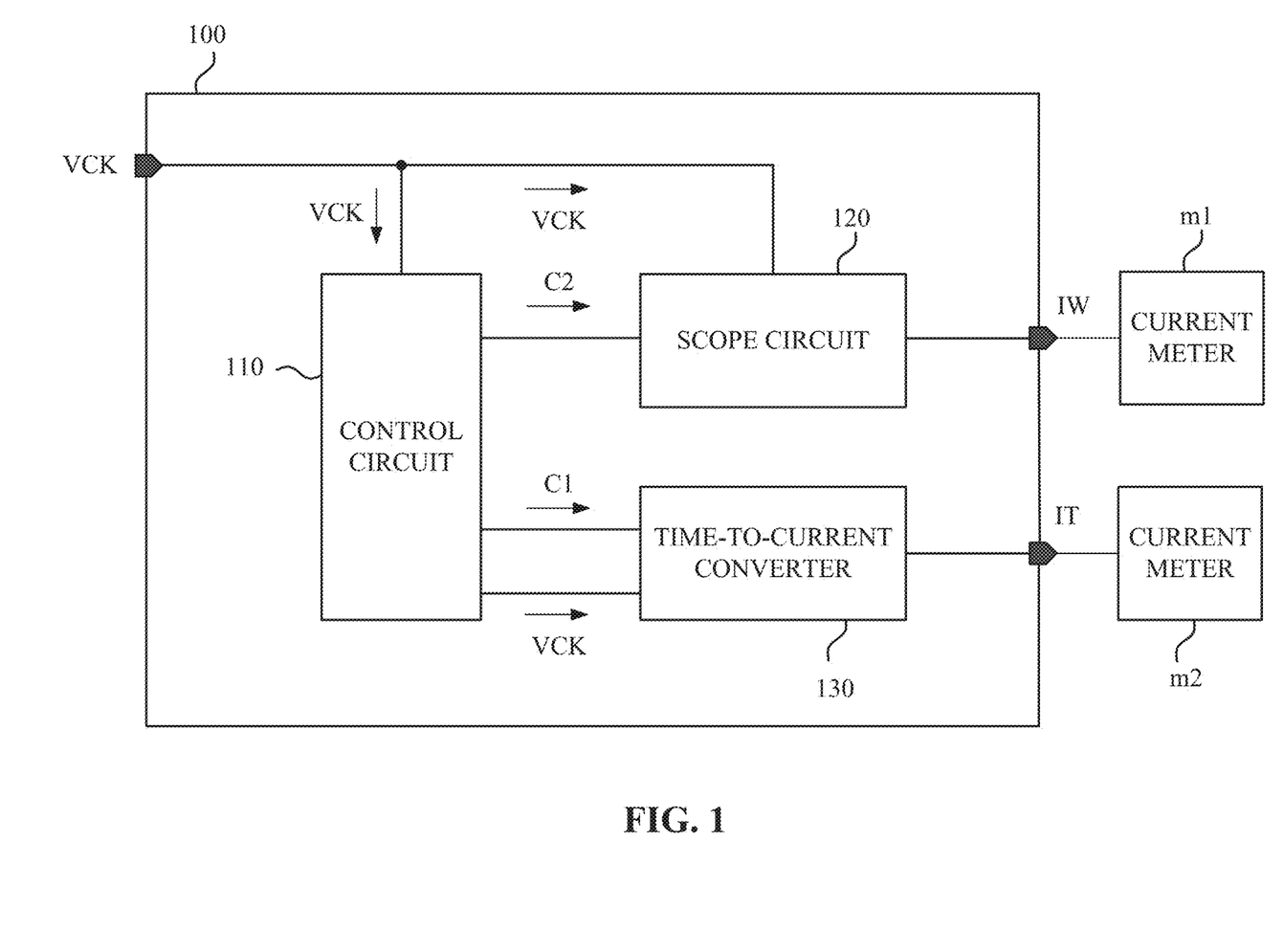
FIG. 1 is a schematic diagram of a device, in accordance with various embodiments of the present disclosure.

FIG. 1 is a schematic diagram of a device 100, in accordance with various embodiments of the present disclosure. In some embodiments, the device 100 is applied in an on-chip oscilloscope. The device 100 is configured to monitor elements or internal signals in a chip.

As illustratively shown in FIG. 1, the device 100 is configured to monitor the voltage signal VCK. In some embodiments, the voltage signal VCK is a periodic voltage signal. For example, the voltage signal VCK is a pulse signal having a predetermined period generated from a voltage-controlled oscillator (VCO). The device 100 is configured to receive the voltage signal VCK. The device 100 is configured to generate a current signal IW and a current signal IT, in response to the voltage signal VCK. In some embodiments, the current signal IW is measured through a current meter m1, and the current signal IT is measured through another current meter m2. In some other embodiments, the current signals IW and IT are measured through the same current meter. In some embodiments, the current signal IW is generated to indicate the amplitude of the voltage signal VCK, and the current signal IT is generated to indicate time intervals of the voltage signal VCK. In other words, the current signal IW is associated with waveform amplitude of the voltage signal VCK, and the current signal IT is associated with the time intervals of the voltage signal VCK. With such arrangement, the current signal IW and the current signal IT are able to be utilized to reconstruct the voltage signal VCK.

For illustration, in some embodiments, the device 100 includes a control circuit 110, a scope circuit 120, and a time-to-current converter 130. The scope circuit 120 and the time-to-current converter 130 are coupled to the control circuit 110. The control circuit 110 is configured to receive the voltage signal VCK, and to generate a control signal C1 according to the voltage signal VCK. The control circuit 110 is further configured to generate a control signal C2 according to the voltage signal VCK and the control signal C1.

Furthermore, the scope circuit 120 is configured to generate the current signal IW according to the control signal C2 and the voltage signal VCK. The time-to-current converter 130 is configured to generate the current signal IT according to the control signal C1 and the voltage signal VCK.

The device 100 in FIG. 1 is given for illustrative purposes. Various configurations of the device 100 are within the contemplated scope of the present disclosure. For example, in some embodiments, the device 100 includes two or more scope circuits 120 to achieve multiple channels.

Figure 2:
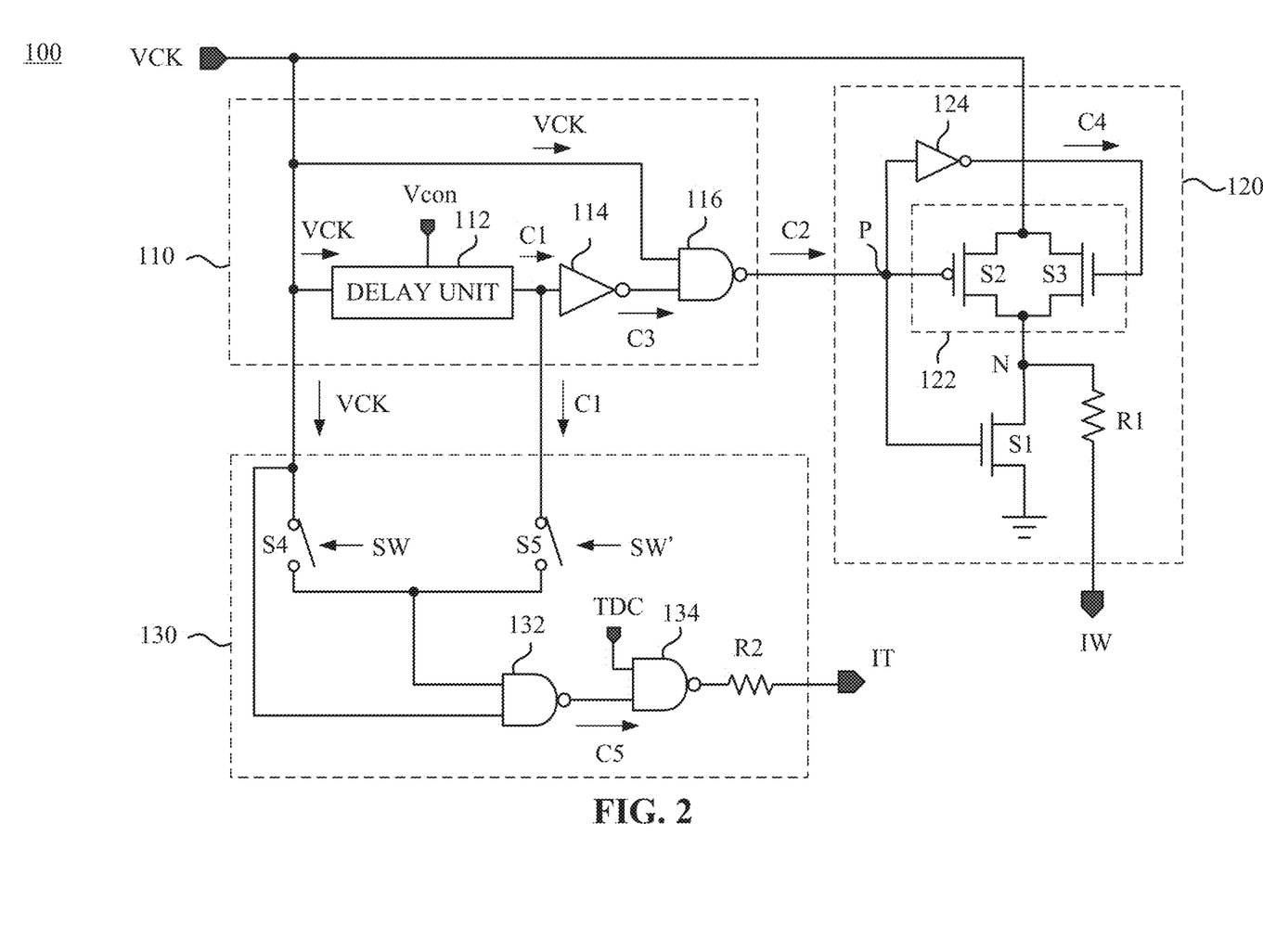
FIG. 2 is a circuit diagram of the device in FIG. 1, in accordance with various embodiments of the present disclosure.

Reference is now made to FIG. 2. FIG. 2 is a circuit diagram of the device 100 in FIG. 1, in accordance with various embodiments of the present disclosure. With respect to the embodiments of FIG. 1, like elements in FIG. 2 are designated with the same reference numbers for ease of understanding.

As illustratively shown in FIG. 2, the control circuit 110 includes a delay unit 112, an inverter 114 and an NAND gate 116. The delay unit 112 has an input terminal and an output terminal. The inverter 114 has an input terminal and an output terminal. The NAND gate 116 has a first input terminal, a second input terminal, and an output terminal. The input terminal of the delay unit 112 is configured to receive the voltage signal VCK. The output terminal of the delay unit 112 is configured to output the control signal C1 to the input terminal of the inverter 114. The delay unit 112 is configured to introduce a delay time to the voltage signal VCK to generate the control signal C1, in which the delay time is controlled according to a control voltage Vcon. The output terminal of the inverter 114 is configured to output a control signal C3 to the first input terminal of the NAND gate 116. The second input terminal of the NAND gate 116 is configured to receive the voltage signal VCK. The NAND gate 116 is configured to generate the control signal C2 according to the control signal C3 and the voltage signal VCK to the scope circuit 120.

The configuration of the control circuit 110 in FIG. 2 is given for illustrative purposes. Various configurations of the control circuit 110 are within the contemplated scope of the present disclosure.

As illustratively shown in FIG. 2, the scope circuit 120 includes a transmission gate 122, an inverter 124, a resistor R1, and a switch S1. The transmission gate 122 is coupled to the output terminal of the NAND gate 116 at a node P. The transmission gate 122 is coupled to the resistor R1 and the switch S1 at a node N. The transmission gate 122 includes a switch S2 and a switch S3. The switch S2 and the switch S3 are coupled in parallel with each other.

For illustration, each of the switches S1-S3 has a first terminal, a second terminal, and a control terminal. The first terminal of the switch S2 is coupled to the first terminal of the switch S3. The first terminals of the switches S2-S3 are configured to receive the voltage signal VCK. The second terminal of the switch S2 is coupled to the second terminal of the switch S3 at the node N. The control terminal of the switch S1, the control terminal of the switch S2 and an input terminal of the inverter 124 are coupled to the output terminal of the NAND gate 116 at the node P. An output terminal of the inverter 124 is coupled to the control terminal of the switch S3. The first terminal of the switch S1 is coupled to a first terminal of the resistor R1 at the node N. The second terminal of the switch S1 is coupled to the ground. A second terminal of the resistor R1 is configured to output the current signal IW. In some embodiments, the second terminal of the resistor R1 is connected to an output pad, in order to be measured through the current meter m1 in FIG. 1.

In some embodiments, the switch S2 is implemented with a P-type transistor, and the switch S1 and the switch S3 are implemented with N-type transistors. Various types of the transistors, which are able to implement the switches S1-S3, are within the contemplated scope of the present disclosure.

For example, in some embodiments, the transistors are metal-oxide-semiconductor filed-effect transistors (MOSFETs).

The configuration of the scope circuit 120 in FIG. 2 is given for illustrative purposes. Various configurations of the scope circuit 120 are within the contemplated scope of the present disclosure. For example, in some embodiments, various types of switching circuits are able to replace the transmission gate 122 or the switch S1. In further embodiments, the switching circuits include a single P-type transistor or a single N-type transistor, and the transmission gate 122 is replaced by a P-type transistor or replaced by an N-type transistor. Alternatively, in some embodiments, the switch S1 is implemented by another transmission gate or implemented by a P-type transistor.

As illustratively shown in FIG. 2, the time-to-current converter 130 has a first input terminal, a second input terminal, and an output terminal. The first input terminal of the time-to-current converter 130 is configured to receive the voltage signal VCK. The delay unit 112 is configured to output the control signal C1 to the second input terminal of the time-to-current converter 130. The output terminal of the time-to-current converter 130 is configured to output the current signal IT according to the voltage signal VCK and the control signal C1. In some embodiments, the output terminal of the time-to-current converter 130 is connected to an output pad, in order to be measured through the current meter m2 in FIG. 1.

As illustratively shown in FIG. 2, in some embodiments, the time-to-current converter 130 includes a switch S4, a switch S5, a NAND gate 132, a NAND gate 134 and a resistor R2. In some embodiments, the switch S4 is turned on when the switch S5 is turned off. For illustration, the switch S4 is controlled by a switch signal SW. The switch S5 is controlled by a switch signal SW'. The switch signal SW' and the switch signal SW are different in phase by about 180 degrees. Each of the NAND gates 132 and 134 has a first input terminal, a second input terminal and an output terminal. The first input terminal of the NAND gate 132 is coupled to the switches S4 and S5. The switch S4 is configured to transmit the voltage signal VCK to the first input terminal of the NAND gate 132 according to the switch signal SW. The switch S5 is configured to transmit the control signal C1 to the first input terminal of the NAND gate 132 according to the switch signal SW'. The second input terminal of the NAND gate 132 is configured to receive the voltage signal VCK. The first input terminal of the NAND gate 134 is coupled to the output terminal of the NAND gate 132. The second input terminal of the NAND gate 134 is configured to receive a test control signal TDC. The output terminal of the NAND gate 134 is coupled to the resistor R2, and the resistor R2 is connected to the output pad, in order to be measured through the current meter m2 in FIG. 1. The operations of the time-to-current converter 130 are provided in the follow description.

The configuration of the time-to-current converter 130 in FIG. 2 is given for illustrative purposes. Various configurations of the time-to-current converter 130 are within the contemplated scope of the present disclosure.

In some embodiments, the device 100 in FIG. 2 is operated in a sample mode or in a reset mode according to settings of the delay unit 112. For example, when the device 100 is operated in the sample mode, the delay unit 112 delays the voltage signal VCK for a delay time, to generate the control signal C1. Accordingly, the scope circuit 120 generates the current signal IW during the delay time. A length of the delay time is adjusted depending on the control voltage Vcon. In some alternative embodiments, when device 100 is operated in the reset mode, the delay time is adjusted to zero. Effectively, the delay unit 112 outputs the voltage signal VCK as the control signal C1 without introducing the delay time. Accordingly, the scope circuit 120 stops generating the current signal IW.

In order to facilitate the illustration of the operations in the sample mode, the operations of the device 100 in FIG. 2 are described with reference to both FIG. 3A and FIG. 4 below. Furthermore, in order to facilitate the illustration of the operations in the reset mode, the operations of the device 100 in FIG. 2 are described with reference to both FIG. 3B and FIG. 4 below.

Figure 3A:
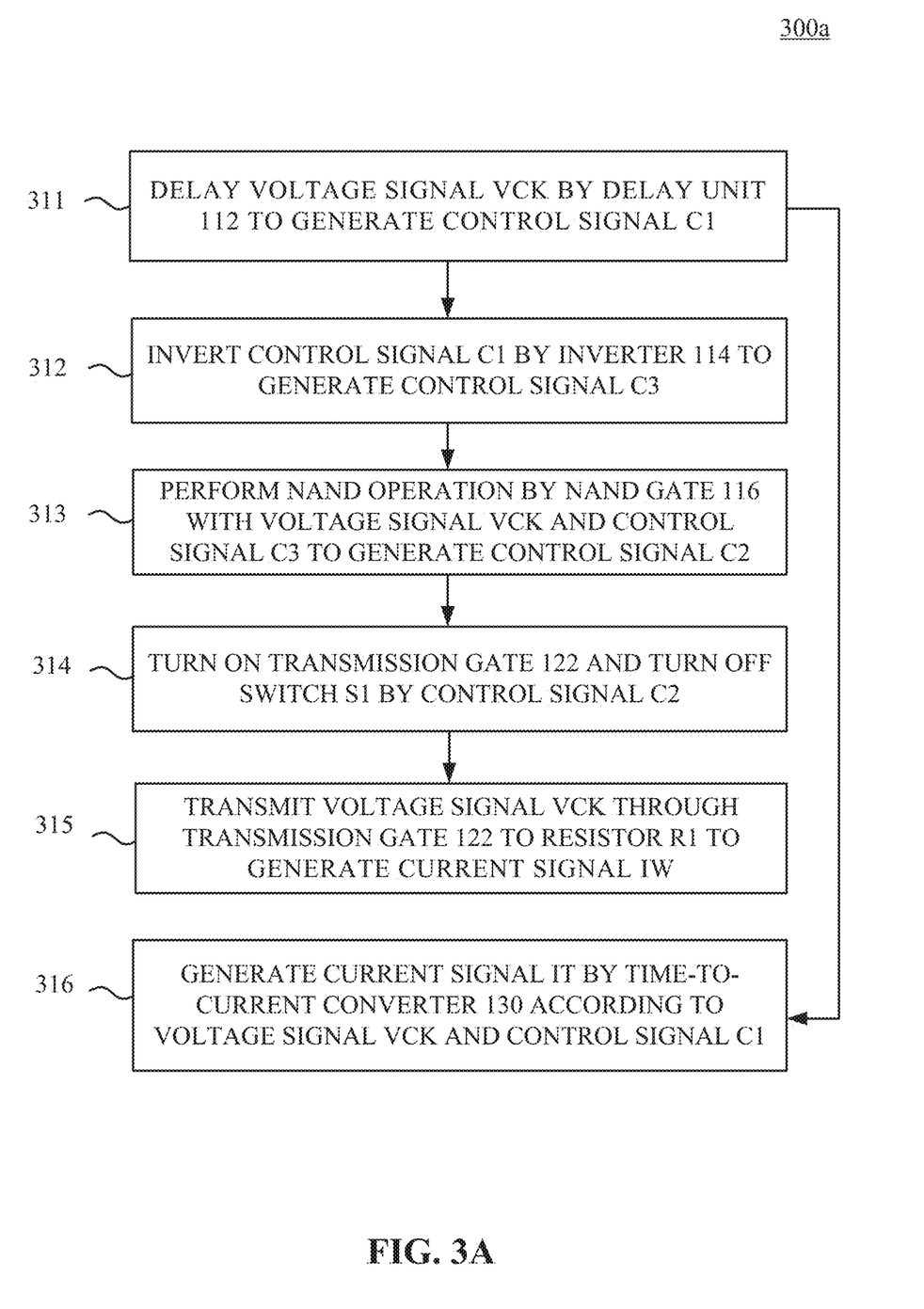
FIG. 3A is a flow chart of a method illustrating operations of the device in FIG. 2 when the device in FIG. 2 is in a sample mode, in accordance with various embodiments of the present disclosure.
Figure 4:
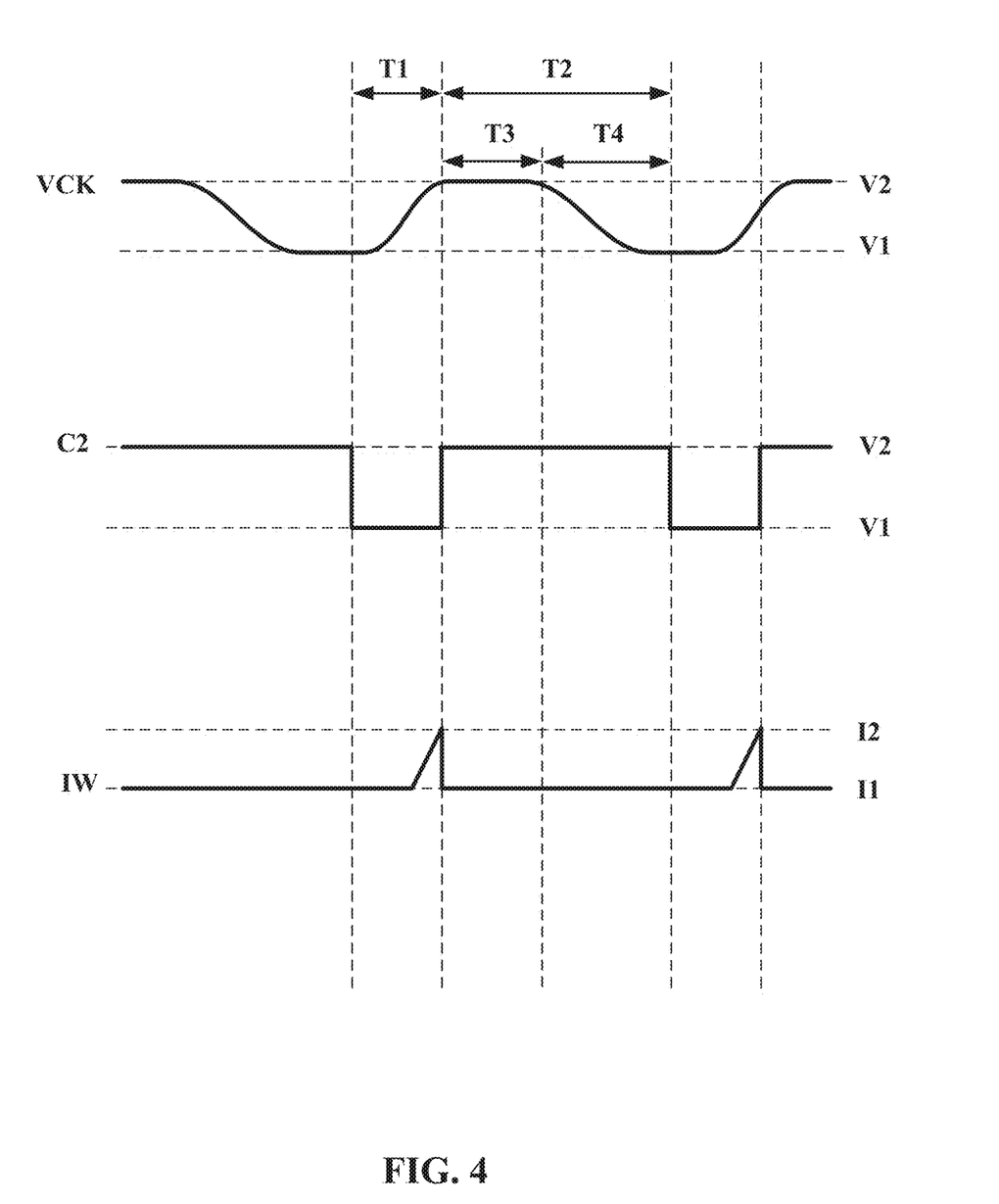
FIG. 4 is a graph of waveforms illustrating operations of the device in FIG. 2, in accordance with various embodiments of the present disclosure.

FIG. 3A is a flow chart of a method 300a illustrating operations of the device 100 in FIG. 2 when the device 100 is operated during a sample time T1 in FIG. 4, in accordance with various embodiments of the present disclosure. FIG. 4 is a graph of waveforms illustrating operations of the device 100 in FIG. 2, in accordance with various embodiments of the present disclosure. As illustratively shown in FIG. 4, in the sample time T1, the device 100 in FIG. 2 is operated in the sample mode.

For ease of understanding, in the following paragraphs, the operations of the method 300a are described with reference to the voltage signal VCK in FIG. 4 transiting from a logic value of 0 to a logic value of 1. As illustratively shown in FIG. 4, in some embodiments, a voltage swing of the voltage signal VCK ranges from a voltage V1 to a voltage V2, in which the voltage V1 corresponds to the logic value of 0 (logically low), and the voltage V2 corresponds to the logic value of 1 (logically high).

Reference is now made to all of FIG. 2, FIG. 3A, and FIG. 4. In some embodiments, the method 300a includes operations 311-316.

In operation 311, the delay unit 112 delays the voltage signal VCK for the sample time T1 to generate the control signal C1. For illustration, the delay unit 112 receives the voltage signal VCK and introduces the delay time, i.e., the sample time T1, to the voltage signal VCK in response to the control voltage Vcon. Since the delay unit 112 delays the voltage signal VCK when the voltage signal VCK transits from the logic value of 0 to the logic value of 1, the control signal C1 still has the logic value of 0 in the sample time T1. Accordingly, the delay unit 112 outputs the control signal C1 having the logic value of 0 to the inverter 114 and the time-to-current converter 130.

In operation 312, the inverter 114 inverts the control signal C1 to generate a control signal C3. As described above, the control signal C1 has the logic value of 0. Accordingly, the control signal C3 inverted by the inverter 114 has the logic value of 1. The inverter 114 then outputs the control signal C3 to the NAND gate 116.

In operation 313, the NAND gate 116 performs an NAND operation with the voltage signal VCK and the control signal C3, to generate the control signal C2. As described above, the voltage signal VCK has the logic value of 1, and the control signal C3 has the logic value of 1. Accordingly, the NAND gate 116 outputs the control signal C2 having the logic value of 0 to the scope circuit 120.

In operation 314, the transmission gate 122 is turned on by the control signal C2, and the switch S1 is turned off by the control signal C2. For illustration, as described above, during the sample time T1, the control signal C2 has the logic value of 0. Accordingly, the switch S1 is turned off and the switch S2 is turned on by the control signal C2. The inverter 124 receives and inverts the control signal C2 to generate a control signal C4. Since the control signal C2 has the logic value of 0, the inverter 124 outputs the control signal C4 having the logic value of 1 to the control terminal of the switch S3. Thus, the switch S3 is also turned on.

In operation 315, the transmission gate 122 transmits the voltage signal VCK to the resistor R1 to generate the current signal IW. As described above, the switches S2 and S3 are turned on, the voltage signal VCK is then transmitted through the switches S2-S3 to the node N. At the same time, since the switch S1 is turned off, the voltage signal VCK at the node N is transmitted through the resistor R1 to generate the corresponding current signal IW. Since the resistance of the resistor R1 is constant, the current signal IW is corresponding to an amplitude of a waveform of the voltage signal VCK. As illustratively shown in FIG. 4, since the voltage signal VCK is gradually transiting from the low voltage V1 to the high voltage V2, the current signal IW is gradually increased from a current I1 to a current I2 after the transmission gate 122 is turned on. Therefore, the current signal IW is associated with the amplitude of the waveform of the voltage signal VCK.

In operation 316, the time-to-current converter 130 receives the voltage signal VCK and the control signal C1, and then generates the current signal IT according to the voltage signal VCK and the control signal C1. The current signal IT is corresponding to the sample time T1. In some embodiments, the time-to-current converter 130 receives the test control signal TDC and generates a DC current signal according to the test control signal TDC. For illustration, when the test control signal TDC has the logic value of 0, an output signal of the NAND gate 134 has the logic value of 1. Under this condition, the resistor R2 generates the DC current signal. When the test control signal TDC has the logic value of 1, and the voltage signal VCK and the control signal C1 are inputted to the time-to-current converter 130, the time-to-current converter 130 generates the current signal IT having a pulse during the sample time T1. For illustration, when the switch S4 is turned on and the switch S5 is turned off, the time-to-current converter 130 generates the current signal IT, which is referred to as a current signal IT1 hereinafter. Under this condition, the voltage signal VCK is transmitted to the first input terminal and the second input terminal of the NAND gate 132. The NAND gate 132 then outputs a control signal C5 being an inverse of the voltage signal VCK to the NAND gate 134. Since the test control signal TDC has the logic value of 1, the logic level at the output terminal of the NAND gate 134 is an inverse of the control signal C5. Accordingly, the logic level at the output terminal of the NAND gate 134 is same as the logic level of the voltage signal VCK. Moreover, when the switch S4 is turned off and the switch S5 is turned on, the time-to-current converter 130 generates the current signal IT, which is referred to as a current signal IT2 hereinafter. Under this condition, the control signal C1 is transmitted to the first input terminal of the NAND gate 132 and the voltage signal VCK is transmitted to the second input terminal of the NAND gate 132. Since the control signal C1 is an inverse of the voltage signal VCK during the sample time T1, the control signal C5 has the logic level of 1 during the sample time T1. Since the test control signal TDC has the logic value of 1, the logic level at the output terminal of the NAND gate 134 has the logic level of 0 during the sample time T1. As the current signals IT1 and IT2 are able to be measured by the current meter m2 in FIG. 1, the average current value of the current signal IT, during the sample time T1, is able to be determined by subtracting the current signal IT2 from the current signal IT1. The sample time T1 is able to be derived from the following equation (1):

$$T1 = \frac{(IT1 - IT2) \times TCK}{Idc} \quad (1)$$

where TCK is the period of the voltage signal VCK, and Idc is the average current value of the DC current signal.

The arrangement of determining the average current value Idc is given for illustrative purposes only. Various arrangements of determining the average current value Idc are within the contemplated scope of the present disclosure.

The above description of the method 300a includes exemplary operations, but the operations of the method 300a are not necessarily performed in the order described. The order of the operations of the method 300a disclosed in the present disclosure are able to be changed, or the operations are able to be executed simultaneously or partially simultaneously as appropriate, in accordance with the spirit and scope of various embodiments of the present disclosure.

Figure 3B:
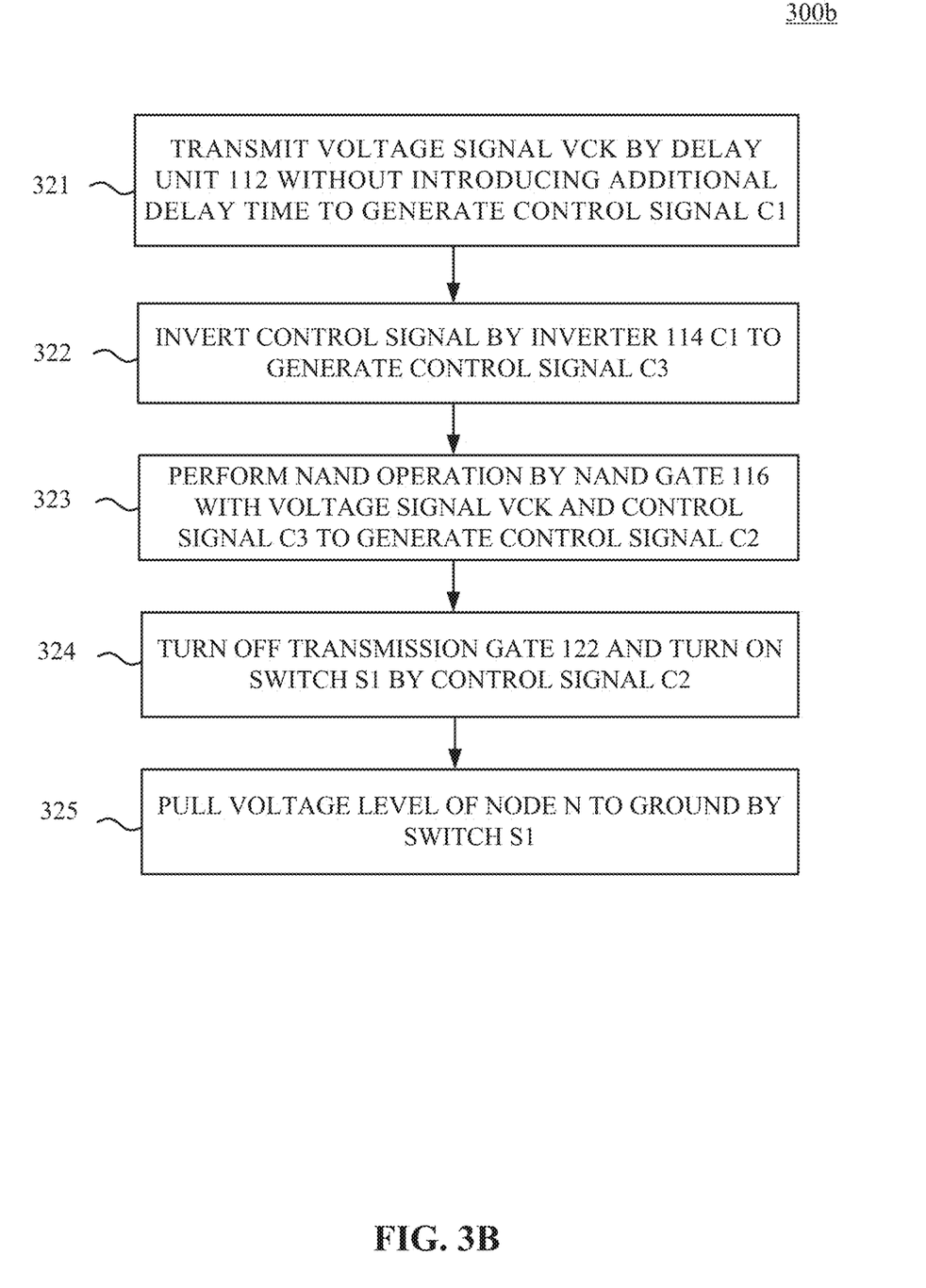
FIG. 3B is a flow chart of a method illustrating operations of the device in FIG. 2 when the device in FIG. 2 is in a reset mode, in accordance with various embodiments of the present disclosure.

Reference is now made to all of FIG. 2, FIG. 3B and FIG. 4. FIG. 3B is a flow chart of a method 300b illustrating operations of the device 100 in FIG. 2 when the device 100 is operated during a reset time T2 in FIG. 4, in accordance with various embodiments of the present disclosure. As illustratively shown in FIG. 4, in the reset time T2, the device 100 in FIG. 2 is operated in the reset mode. As described above, when device 100 in FIG. 2 is operated in the reset mode, the delay unit 112 stops delaying the voltage signal VCK.

In some embodiments, the method 300b includes operations 321-326. In operation 321, the delay unit 112 transmits the voltage signal VCK without introducing additional delay time, to generate the control signal C1. In other words, in the reset mode, the delay unit 112 transmits the voltage signal VCK as the control signal C1 to the inverter 114. For illustration of FIG. 4, the voltage signal VCK is transited to the logic value of 1 in a time T3. Since the delay unit 112 transmits the voltage signal VCK without introducing additional delay time, the control signal C1 also has the logic value of 1. In the time T4, the voltage signal VCK is transiting from the voltage V2 to the voltage V1. Accordingly, the control signal C1 also transits from the logic value of 1 to the logic value of 0 in the time T4.

In operation 322, the inverter 114 inverts the control signal C1 to generate the control signal C3. For illustration of FIG. 4, in the time T3, since the control signal C1 has the logic value of 1, the control signal C3 has the logic value of 0. In the time T4, since the control signal C1 is transiting from the logic value of 1 to the logic value of 0, the control signal C3 is transiting from the logic value of 0 to the logic value of 1.

In operation 323, the NAND gate 116 performs an NAND operation with the voltage signal VCK and the control signal C3, to generate the control signal C2. For illustration of FIG. 4, in the time T3, since the voltage signal VCK has the logic value of 1 and the control signal C3 has the logic value of 0, the control signal C2 has the logic value of 1. In the time T4, since the voltage signal VCK is transiting to the logic value of 0 and the control signal C3 is transiting to the logic value of 1, the NAND gate 116 outputs the control signal C2 having the logic value of 1. That is, the control signal C2 has the logic value of 1 in the reset time T2.

In operation 324, the transmission gate 122 is turned off by the control signal C2, and the switch S1 is turned on by the control signal C2. As described above, in the reset time T2, since the control signal C2 has the logic value of 1, the switch S1 is turned on and the switch S2 is turned off. Moreover, since the control signal C4 outputted by the inverter 124 has the logic value of 0, the switch S3 is turned off.

In operation 325, the switch S1 pulls the voltage level of the node N to the ground. For illustration, as described above, in the sample time T1, the transmission gate 122 transmits the voltage signal VCK to the node N. Effectively, the voltage level of the node N is pulled up to a voltage level of the voltage signal VCK in operation 315. When the transmission gate 122 is turned off and the switch S1 is turned on, the voltage level of the node N is then pulled down to the ground via the switch S1. Accordingly, the electrical signals on the resistor R1 or the switch S1 is bypassed to the ground. Thus, there is no current flowing through the resistor R1. As a result, the scope circuit 120 stops generating the current signal IW in the reset time T2.

The above description of the method 300b includes exemplary operations, but the operations of the method 300b are not necessarily performed in the order described. The order of the operations of the method 300b disclosed in the present disclosure are able to be changed, or the operations are able to be executed simultaneously or partially simultaneously as appropriate, in accordance with the spirit and scope of various embodiments of the present disclosure.

Figure 5:
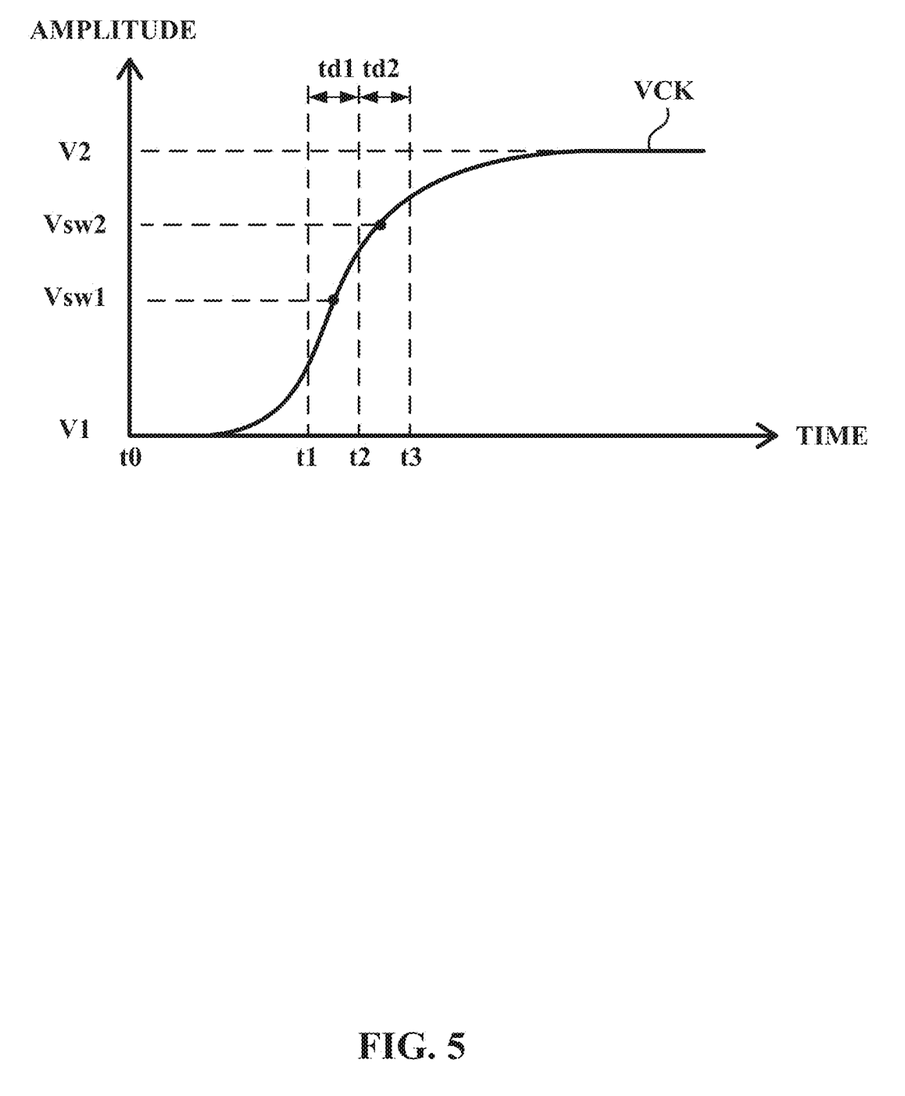
FIG. 5 is a schematic diagram illustrating a voltage signal reconstructed through the device in FIG. 2, in accordance with various embodiments of the present disclosure.

FIG. 5 is a schematic diagram illustrating the voltage signal VCK reconstructed through the device 100 in FIG. 2, in accordance with various embodiments of the present disclosure. For ease of understanding, FIG. 5 illustrates a partial enlarged view of the waveform of the voltage signal VCK.

Time intervals td1-td2 and the corresponding amplitudes Vswi of the voltage signal VCK are illustrated in FIG. 5. As illustratively shown in FIG. 5, the time interval td1 is a time difference between a time t1 and a time t2, and the time interval td2 is a time difference between the time t2 and a time t3.

In some embodiments, the amplitude Vswi of the reconstructed voltage signal VCK is derived from the equation (2) below:

$$Vswi = (Iavi \times Rr \times Tck)/tdi \quad (2)$$

Where Vswi represents an average voltage value of the reconstructed voltage signal VCK during a time interval tdi, Iavi represents an average current value within the time interval tdi, Rr represents a resistance of the resistor R1 in FIG. 2, and Tck represents a period of the voltage signal VCK. The detailed operations to derive Iavi and tdi are described with reference to FIG. 2.

In some embodiments, the delay unit 112 in FIG. 2 delays the voltage signal VCK for the delay time t1 during some periods of the voltage signal VCK. The delay time t1 is controlled according to the control voltage Vcon. The device 100 in FIG. 2 then performs the method 300a in FIG. 3A, in order to generate the current signal IW and the current signal IT. Under this condition, the current signal IW is referred to as a current signal IW1, and the current signal IT is referred to as a current signal IT1. In other words, the current signal IW1 represents the current signal IW when the delay unit 112 delays the voltage signal VCK for the delay time t1. The current signal IT1 represents the current signal IT when the delay unit 112 delays the voltage signal VCK for the delay time t1. With the operation 316 of the method 300a in FIG. 3A and the equation (1) above, the delay time t1 is able to be determined according to the current signal IT1.

Then, the delay unit 112 in FIG. 2 delays the voltage signal VCK for the delay time t2 during other periods of the voltage signal VCK. The delay time t2 is controlled according to the control voltage Vcon. The device 100 in FIG. 2 then performs the method 300a in FIG. 3A, in order to generate the current signal IW and the current signal IT. Under this condition, the current signal IW is referred to as a current signal IW2, and the current signal IT is referred to as a current signal IT2. In other words, the current signal IW2 represents the current signal IW when the delay unit 112 delays the voltage signal VCK for the delay time t2. The current signal IT2 represents the current signal IT when the delay unit 112 delays the voltage signal VCK for the delay time t2. With the operation 316 of the method 300a in FIG. 3A and the equation (1) above, the delay time t2 is able to be determined according to the current signal IT2.

As the delay time t1 and the delay time t2 are determined, the time interval td1 is thus generated according to the delay time t1 and the delay time t2. For example, the time interval td1 is determined by subtracting the delay time t1 from the delay time t2. As the current signal IW1 and the current signal IW2 are determined, the average current value Iav1 within the time interval td1 is able to be generated according to the current signal IW1 and the current signal IW2. The average current value Iav1 within the time interval td1 is a difference between a current value of the current signal IW1 and a current value of the current signal IW2. For example, the average current value Iav1 is determined by subtracting the current signal IW1 from the current signal IW2.

Further, the delay unit 112 in FIG. 2 delays the voltage signal VCK for the delay time t3 during other periods of the voltage signal VCK. The delay time t3 is controlled according to the control voltage Vcon. The device 100 in FIG. 2 then performs the method 300a in FIG. 3A, in order to generate the current signal IW and the current signal IT. Under this condition, the current signal IW is referred to as a current signal IW3, and the current signal IT is referred to as a current signal IW3. In other words, the current signal IW3 represents the current signal IW when the delay unit 112 delays the voltage signal VCK for the delay time t3. The current signal IT3 represents the current signal IT when the delay unit 112 delays the voltage signal VCK for the delay time t3. With the operation 316 of the method 300a in FIG. 3A and the equation (1) above, the delay time t3 is able to be determined according to the current signal IT3.

As the delay time t2 and the delay time t3 are determined, the time interval td2 is thus generated according to the delay time t2 and the delay time t3. For example, the time interval td2 is determined by subtracting the delay time t2 from the delay time t3. As the current signal IW2 and the current signal IW3 are determined, the average current value Iav2 within the time interval td2 is able to be generated according to the current signal IW2 and the current signal IW3. The average current value Iav2 within the time interval td2 is a difference between a current value of the current signal IW2 and a current value of the current signal IW3. For example, the average current value Iav2 is determined by subtracting the current signal IW2 from the current signal IW3.

As illustratively shown in FIG. 5, as the time intervals td1-td2 and the corresponding amplitudes Vsw1-Vsw2 are determined, a portion of the voltage signal VCK is reconstructed. Accordingly, by repeatedly performing the operations above, the voltage signal VCK is able to be reconstructed according to the equation (2).

The operations of reconstructing the voltage signal VCK in above embodiments are given for illustrative purposes. Various operations of reconstructing the voltage signal VCK are within the contemplated scope of the present disclosure.

In some embodiments, the device 100 in FIG. 2 is implemented on chip with a small area. Thus, the device 100 is suitable for performing testing at WAT stage and has a loading only about 10 fF, which is sufficient to prevent monitored signals from distortion. Moreover, in some embodiments, the device 100 is configured to monitor internal signals in the chip without any external oscilloscope. In various embodiments, the device 100 is able to measure the on-chip elements at WAT stage or before a package process.

In some embodiments, the device 100 in FIG. 2 is configured to monitor a power supply voltage in an integrated circuit (IC) when the power supply voltage has a periodic voltage drop. In some embodiments, the device 100 in FIG. 2 is configured to monitor a specific periodic waveform to obtain a rise time, a fall time or a slew rate of the specific periodic waveform.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes a control circuit and a scope circuit. The control circuit is configured to delay a voltage signal to generate a first control signal. The scope circuit is configured to be operated in one of a first mode and a second mode according to the first control signal. In the first mode, the scope circuit is configured to generate a first current signal indicating amplitudes of the voltage signal, and in the second mode, the scope circuit is configured to stop generating the first current signal.

Also disclosed is a device that includes a Control circuit and a scope circuit. The control circuit is configured to delay a voltage signal to generate a first control signal, and to generate a second control signal according to the first control signal and the voltage signal. The scope circuit is configured to generate a first current signal in response to the second control signal. The scope circuit comprises a transmission gate configured to be turned on according to the second control signal to transmit the voltage signal for generating the first current signal.

Also disclosed is a method that includes the operation below. A voltage signal is delayed by a control circuit to generate a first control signal, and to generate a second control signal according to the first control signal. A transmission gate is controlled by the second control signal to transmit the voltage signal. A first current signal is generated associated with the voltage signal. The first current signal indicates amplitudes of the voltage signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
   a control circuit configured to receive a voltage signal from a voltage-controlled oscillator, delay the voltage signal for a delay time to generate a first control signal, and to generate a second control signal according to the first control signal and the voltage signal; and a scope circuit comprising a transmission gate and configured to receive the voltage signal from the voltage-controlled oscillator and to be operated in a first mode and a second mode according to the second control signal, wherein in the first mode, the scope circuit is configured to transmit the voltage signal and to generate a first current signal corresponding to amplitudes of a waveform of the voltage signal, and in the second mode, the scope circuit is configured to stop generating the first current signal.

2. The device of claim 1, wherein in the first mode, the transmission gate is configured to be turned on to transmit the voltage signal.

3. The device of claim 2, wherein in the second mode, the transmission gate is configured to be turned off.

4. The device of claim 1, wherein the scope circuit comprises:

a first switch, wherein in the second mode, the first switch is configured to be turned on.

5. The device of claim 4, wherein in the first mode, the first switch is configured to be turned off.

6. The device of claim 1, wherein the control circuit comprises:

a delay unit configured to delay the voltage signal, to generate the first control signal, wherein the delay unit is controlled according to a control voltage.

7. The device of claim 1, wherein the first control signal and the second control signal are different in phase by about 180 degrees, and the device further comprises:

a time-to-current converter configured to generate a second current signal according to the voltage signal and the first control signal.

8. A device, comprising:

a control circuit configured to receive a voltage signal from a voltage-controlled oscillator, delay the voltage signal to generate a first control signal, and to generate a second control signal according to the first control signal and the voltage signal; and a scope circuit configured to receive the voltage signal from the voltage-controlled oscillator and to generate a first current signal in response to the second control signal, the scope circuit comprising a transmission gate configured to be turned on according to the second control signal to transmit the voltage signal for generating the first current signal.

9. The device of claim 8, further comprising:

a time-to-current converter configured to generate a second current signal according to the first control signal and the voltage signal.

10. The device of claim 9, wherein the first current signal indicates an amplitude of the voltage signal, and the second current signal indicates time intervals of the voltage signal.

11. The device of claim 8, wherein the control circuit comprises:

a delay unit configured to delay the voltage signal to generate the first control signal, wherein the delay unit is controlled according to a control voltage; and an inverter configured to invert the first control signal to generate a third control signal.

12. The device of claim 11, wherein the control circuit further comprises:

an NAND gate configured to generate the second control signal in response to the third control signal and the voltage signal.

13. The device of claim 8, the scope circuit further comprises:

a resistor coupled to the transmission gate at a node and configured to output the first current signal, wherein the resistor is further coupled to an output pad, in order to be measure through a current meter.

14. The device of claim 13, wherein the scope circuit further comprises:

a first switch coupled to the node, wherein in a reset mode, the first switch is configured to pull a voltage level of the node to a ground according the second control signal.

15. The device of claim 8, wherein the scope circuit further comprises:

an inverter configured to invert the second control signal to generate a fourth control signal, wherein the transmission gate is further configured to be turned on according to the second control signal and the fourth control signal.

16. The device of claim 8, wherein the transmission gate comprises:

a first switch configured to be turned on to transmit the voltage signal in response to the second control signal; and a second switch coupled in parallel with the first switch, and configured to be turned on to transmit the voltage signal according the second control signal.

17. A method, comprising:

receiving, by a control circuit and a transmission gate, a voltage signal from a voltage-controlled oscillator;

delaying, by the control circuit, the voltage signal to generate a first control signal and to generate a second control signal according to the first control signal and the voltage signal;

controlling the transmission gate by the second control signal to transmit the voltage signal; and generating a first current signal associated with the voltage signal, wherein the first current signal corresponds to amplitudes of a waveform of the voltage signal.

18. The method of claim 17, further comprising:

controlling a time-to-current converter by the first control signal to generate a second current signal, wherein the second current signal indicates time intervals of the voltage signal.

19. The method of claim 17, wherein delaying the voltage signal comprises:

inverting the first control signal to generate a third control signal; and performing an NAND operation in response to the third control signal and the voltage signal to generate the second control signal.

20. The method of claim 17, further comprising:

pulling a voltage level associated with the transmission gate to a ground according the second control signal; and stopping generating the first current signal.

* * * * *